Figure 1:
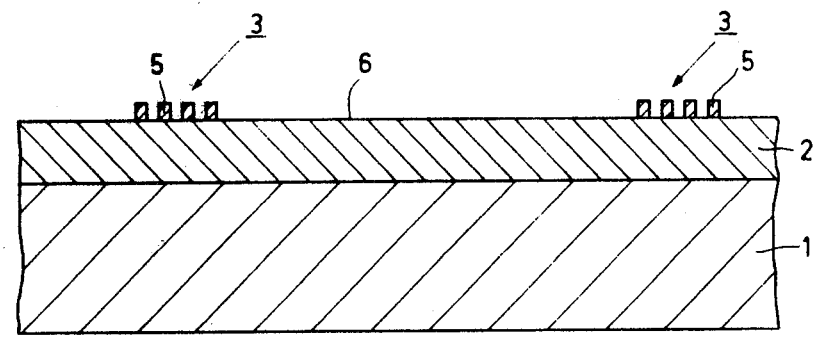

United States Patent [19]

Punter et al.

[11] 4,381,957

[45] May 3, 1983

[54] METHOD OF DIFFUSING ALUMINUM

[75] Inventors: Hendrik Punter; Kornelis J. Wagenaar, both of Nijmegen, Netherlands

[73] Assignee: U.S. Philips Corporation, New York, N.Y.

[21] Appl. No.: 321,960

[22] Filed: Nov. 16, 1981

[30] Foreign Application Priority Data

Dec. 9, 1980 [NL] Netherlands ............ 8006668

[51] Int. Cl.³ .................................... H01L 21/225
[52] U.S. Cl. ........................... 148/188; 148/175; 148/190; 148/191
[58] Field of Search ............... 148/188, 187, 175, 190, 148/191

[56] References Cited

U.S. PATENT DOCUMENTS

| | | | |
|---|---|---|---|
| 3,375,146 | 3/1968 | Wiesner | 148/188 X |
| 3,436,282 | 4/1969 | Shoda | 148/188 X |
| 3,998,662 | 12/1976 | Anthony et al. | 148/187 X |
| 4,066,485 | 1/1978 | Rosnowski et al. | 148/188 |
| 4,290,830 | 9/1981 | Mochizuki et al. | 148/187 |

*Primary Examiner*—G. Ozaki
*Attorney, Agent, or Firm*—Thomas A. Briody; Robert T. Mayer; Steven R. Biren

[57] ABSTRACT

A method of manufacturing a semiconductor device in which an aluminum-containing layer, hereinafter referred to as the aluminum source, is locally provided on a semiconductor body 1,2 of silicon and, in a subsequent diffusion treatment, aluminum is diffused from the aluminium source 3 into the silicon body 1,2, and an aluminum-doped region 4 is formed in the silicon body 1,2, characterized in that, prior to the diffusion treatment, the aluminum source 3 is divided into parts 5 each having an area which is small as compared with the area of the region 4 to be formed, with a mutual distance which is smaller than double the distance over which the aluminum in the diffusion treatment is diffused laterally into the silicon body 1,2, and which parts 5 have an uninterrupted shape and are so small that during the diffusion treatment their uninterrupted shape remains unvaried.

13 Claims, 2 Drawing Figures

METHOD OF DIFFUSING ALUMINUM

The invention relates to a method of manufacturing a semiconductor device in which an aluminium-containing layer, hereinafter referred to as the aluminium source, is locally provided on a semiconductor body of silicon and in a subsequent diffusion treatment aluminium is diffused from the aluminium source into the silicon body and an aluminium-doped region is formed in the silicon body.

A method of the kind mentioned in the opening paragraph is known, for example, from Netherlands patent application No. 7602960.

In this method an aluminium layer is provided on a silicon body, which layer is restricted, by means of photoetching methods, to locations where said layer will serve as a doping source in a diffusion treatment.

Diffusion treatments in which an aluminium source is provided directly on a silicon surface have not obtained the popularity which they deserve from a point of view of their simplicity, for example, with respect to a diffusion treatment in a closed ampoule with a diffusion source consisting of aluminium-containing silicon powder.

This is probably due to the following problems. With a source consisting of metallic aluminium on the silicon surface it is difficult to obtain a regular and reproducibly formed diffused region in the silicon body. Such a region often shows bulges both in the depth direction and also in the lateral direction.

It is also possible that during the diffusion treatment drops are formed in the aluminium source, so that both in the aluminium source and in the aluminium-doped regions interruptions may occur. For example in the diffusion of regions for island insulation, such interruptions may be disastrous for the operation of the semiconductor device to be manufactured.

Moreover it has often proved to be difficult to remove an oxide layer present on the aluminium source after the diffusion treatment.

One of the objects of the invention is to avoid the said problems at least to a considerable extent. The invention is based inter alia on the recognition of the fact that a considerable improvement can be achieved by adapting the form of the source.

According to the invention, the method mentioned in the opening paragraph is therefore characterized in that, prior to the diffusion treatment, the aluminium source is divided into parts each having an area which is small as compared with the area of the region to be formed, with a mutual distance which is smaller than double the distance over which the aluminium in the diffusion treatment is diffused laterally into the silicon body, and which parts are so small that their uninterrupted shape is maintained during the diffusion treatment.

By means of the method according to the invention, aluminium-doped regions formed regularly and reproducibly both in the depth direction and in the lateral direction are obtained. Drop formation in the aluminium layer and undesired interruptions in the doped region are avoided, while an oxide layer formed during the diffusion can easily be removed.

The distance between the said parts is chosen to be as small as possible since in that case the aluminium concentration at the surface of the doped region is as high as possible.

In a first modified embodiment of the method in accordance with the invention the aluminium source is preferably given a shape corresponding to the shape of the doped region to be formed and is simultaneously divided into the said parts.

For such a treatment only one photoetching step is necessary when using conventional photolithographic methods.

The said first modified embodiment gives very-clear results in particular when the thickness of the aluminium source is chosen to be equal to at least 0.5 $\mu$m. Layers of such a thickness are often desired to obtain deep, doped regions, for example for island insulation.

The surface of the parts of the aluminium source is preferably given dimensions of approximately 6 $\mu$m $\times$ 6 $\mu$m.

The mutual distance of the parts may be comparatively small, preferably approximately 4 $\mu$m.

The removal of an oxide layer present on the aluminium layer after the diffusion treatment in the said first modified embodiment is very complete when, preceding the diffusion treatment, the formed parts are subjected to an etching treatment in which oxide is removed from the surface of the parts.

The etching treatment is preferably carried out by means of an etching bath consisting of a solution of hydrogen fluoride in water and the etching duration is approximately 30 seconds.

In a second modified embodiment of the method in accordance with the invention, the aluminium source is preferably given a shape corresponding to the shape of the doped region to be obtained and is then divided into the said parts by a treatment in which the grain boundaries in the aluminium source are etched preferentially. In this modified embodiment the parts correspond to the grains of the aluminium source.

When the second modified embodiment is used, one photoetching step will also suffice.

The said second modified embodiment gives very clear results in particular when the thickness of the aluminium source is chosen to be at most equal to 0.2 $\mu$m.

In the second modified embodiment the size of the parts is determined by the grain size of the aluminium of the aluminium source. The mutual distance of the parts obtained by means of the last-mentioned modified embodiment is sufficient to avoid the above-described problems at least to a considerable extent.

A particularly favourable result can be obtained with a very short etching treatment, for example, in an etching bath consisting of a solution of hydrogen fluoride in water in approximately 30 seconds.

Comparatively deep doped regions can be obtained by means of the method of the invention in a regular and reproducible manner.

For example, in a preferred embodiment of the method of the invention, in order to obtain an island isolation by isolation diffusion, the silicon body is formed by providing on a p-type conductive substrate an n-type conductive epitaxial layer and the doped region is formed by diffusion from the free surface of the epitaxial layer throughout the thickness of the epitaxial layer.

Semiconductor devices having thick epitaxial layers, for example, bipolar transistors with high collector-emitter voltages with open base, can be made by means of the method in accordance with the invention.

During the diffusion treatment, the aluminium of the aluminium source alloys at the surface of the semiconductor body with the silicon.

In order to avoid doping of parts of the silicon body present beside the diffusion source, the diffusion treatment is preferably carried out in an oxidizing atmosphere. An oxide layer is formed on the source and the free surface of the silicon body.

It may occur that after the diffusion treatment it appears that the aluminium concentration at the free surface of the doped region is lower than in deeper located parts of the region.

Therefore, the diffusion treatment is preferably completed by a second diffusion treatment in which, at a part of the surface of the silicon body separated from the first-mentioned region, a second region is formed by means of boron as a dopant and having a smaller depth than the first region, and the surface of the first region is simultaneously subjected to the second diffusion treatment. The second region is, for example, a base of a transistor.

Figure 2:
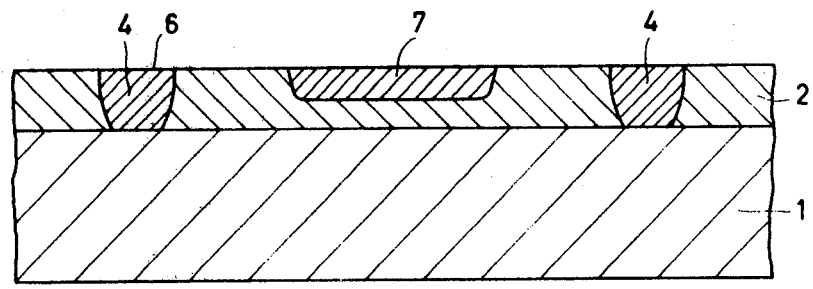

The invention will now be described with reference to an example and a drawing. In the drawing, FIGS. 1 and 2 are diagrammatic sectional views of a part of a semiconductor device in successive stages of its manufacture by means of the method according to the invention.

In the example is described the manufacture of a transistor in which an aluminium-containing layer 3 is provided locally on a semiconductor body 1,2 of silicon (see the Figures). This layer serves as a source in a subsequent diffusion treatment in which aluminium is diffused from the aluminium source 3 into the silicon body 1,2 and an aluminium-doped region 4 is formed in the silicon body 1,2.

According to the invention, the aluminium source 3 is divided, prior to the diffusion treatment, into parts 5 each having an area which is small as compared with the surface area of the region 4 to be formed. The mutual distance of the parts 5 is smaller than double the distance over which the aluminium during the diffusion treatment diffuses laterally into the silicon body 1,2. The parts 5 are so small that their uninterrupted shape during the diffusion treatment remains unvaried.

As a result of this it is achieved that both in the direction of depth and in the lateral direction regions are obtained which are regularly and reproducibly doped with aluminium. Drop formation in the aluminium layer and undesired interruptions in the doped region are avoided. An oxide layer formed on the aluminium during the diffusion can easily be removed.

The division of the aluminium source 3 into the parts 5 can take place simultaneously with the desing of the source 3 itself, namely in the same photoetching step. This method is used in particular when the thickness of the source is not very small, preferably larger than 0.5 μm.

The division of the aluminium source 3 into the parts 5 may also take place after the design of the source 3, namely by a treatment in which the grain boundaries in the aluminium source are etched preferentially. This method is used in particular when the thickness of the source is not too large, and preferably is smaller than 0.2 μm.

The silicon body is preferably formed by providing an n-type conductive epitaxial layer 2 on a p-type conductive substrate 1 and the doped region 4 is formed by diffusion from the free surface 6 of the epitaxial layer 2 throughout the thickness of said epitaxial layer.

The diffusion treatment is preferably carried out in an oxidizing atmosphere in which, due to oxide formation on the source and the silicon body, doping of parts of the silicon body situated beside the source is counteracted.

It may occur that the aluminium content at the free surface of the doped region 4 is lower than in deeper-located parts of the region.

This is avoided if a second diffusion treatment is carried out in which, at a part of the surface 6 of the silicon body 1,2 separated from the first-mentioned region 4, a second region 7 is formed by means of boron and having a smaller depth than the first region 4, and simultaneously the surface of the first region 4 is subjected to the second diffusion treatment.

Starting material in the manufacture is, for example, a 450 μm thick p-type conductive substrate 1 having a resistivity of 35 Ωcm. On said substrate is deposited in a usual manner a 40 μm thick n-type conductive epitaxial layer 2 having a resistivity of 40 Ωcm.

A 0.5 μm thick aluminium layer, not shown is provided on the layer 2 and therefrom the aluminium source 3 is locally formed photolithographically in a usual manner.

On the surface the source 3 is locally approximately 36 μm wide and consists of parts of approximately 6 μm×6 μm with a mutual distance of approximately 4 μm.

Oxide, if any, formed during the provision of the aluminium source 3 is removed by etching in an etching bath consisting of a solution of a few percent. of hydrogen fluoride in water for 30 seconds. During etching, the grain boundaries can also be etched preferentially, but said etching will not continue throughout the layer when the aluminium layer has the said thickness.

With aluminium layer thicknesses of 0.2 μm and smaller, the division into parts 5 may coincide with the removal of an oxide layer in the said etching bath. The preferential etching of grain boundaries will then continue throughout the aluminium layer. The parts 5 then have the shape of the grains in the aluminium layer.

In the diffusion treatment, aluminium is diffused from the source 3 through the epitaxial layer 2 and the region 4 is formed. The diffusion treatment lasts 10 hours, takes place at 1,200° C. in an atmosphere which comprises approximately 10% by volume of oxygen.

In the diffusion treatment, the source 3 disappears. In a usual manner, an oxide layer formed at the area of the region 4 may be removed. Coinciding with the formation of the last-mentioned oxide layer may be that the aluminium concentration at the surface 6 of the epitaxial layer is comparatively low.

For compensation, in a second diffusion treatment boron is diffused at the area of the region 4 and elsewhere via the surface 6, so that the concentration in the region 4 is replenished again, and in the epitaxial layer 2 the second region 7 is formed which may serve as a base of the transistor.

Boron may be diffused in the usual manner starting from boron bromide as a source for 4 hours at 1,160° C. The second region 7 is, for example, 6 μm deep.

The manufacture of the transistor is continued in any usual manner.

The invention is not restricted to the embodiment described. It will be obvious to those skilled in the art that many variations are possible.

For example, a buried layer may be formed in the epitaxial layer. The aluminium source used may comprise other desired elements, for example, silicon, in addition to the aluminium.

The above-described isolation diffusion may advantageously be used in particular with thick layers. The method according to the invention may also be used effectively for regions having a different function and in thin epitaxial layers.

What is claimed is:

1. A method of manufacturing a semiconductor device in which an aluminium-containing layer, hereinafter referred to as the aluminium source, is locally provided on a semiconductor body of silicon and in a subsequent diffusion treatment aluminium is diffused from the aluminium source into the silicon body and an aluminium-doped region is formed in the silicon body, characterized in that, prior to the diffusion treatment, the aluminium source is divided into parts each having an area which is small as compared with the area of the region to be formed, with a mutual distance which is smaller than double the distance over which the aluminium in the diffusion treatment is diffused laterally into the silicon body, and which parts are so small that their uninterrupted shape is maintained during the diffusion treatment.

2. A method as claimed in claim 1, characterized in that the aluminium source is given a shape corresponding to the shape of the doped region to be formed and is divided simultaneously into the said parts.

3. A method as claimed in claim 2, characterized in that the thickness of the aluminium source is chosen to be at least equal to 0.5 $\mu$m.

4. A method as claimed in claim 2 or 3, characterized in that the surface of the parts of the aluminium source is given dimensions of approximately 6 $\mu$m $\times$ 6 $\mu$m.

5. A method as claimed in claim 1 or 2, characterized in that the mutual distance of the parts is approximately 4 $\mu$m.

6. A method as claimed in claim 2 or 3, characterized in that, prior to the diffusion treatment, the formed parts are subjected to an etching treatment in which oxide is removed from the surface of the parts.

7. A method as claimed in claim 6, characterized in that the etching treatment is carried out by means of an etching bath consisting of a solution of hydrogen fluoride in water and that the etching duration is approximately 30 seconds.

8. A method as claimed in claim 1, characterized in that the aluminium source is given a shape corresponding to the shape of the region to be formed and is then divided into the said parts by a treatment in which the grain boundaries in the aluminium source are etched preferentially.

9. A method as claimed in claim 8, characterized in that the thickness of the aluminium source is chosen to be at most equal to 0.2 $\mu$m.

10. A method as claimed in claim 8 or 9, characterized in that the etching treatment is carried out by means of an etching bath consisting of a solution of hydrogen fluoride in water and that the etching duration is approximately 30 seconds.

11. A method as claimed in claim 1 or 2, characterized in that the silicon body is formed by providing an n-type conductive epitaxial layer on a p-type conductive substrate, and that the doped region is formed by diffusion from the free surface of the epitaxial layer throughout the thickness of said epitaxial layer.

12. A method as claimed in claim 1 or 2, characterized in that the diffusion treatment is carried out in an oxidizing atmosphere.

13. A method as claimed in claim 1 or 2, characterized in that the diffusion treatment is completed by a second diffusion treatment in which, at a part of the surface of the silicon body separated from the first-mentioned region, a second region is formed by means of boron as a dopant and with a smaller depth than the first region, and that the surface of the first region is simultaneously subjected to the second diffusion treatment.

* * * * *

UNITED STATES PATENT AND TRADEMARK OFFICE
CERTIFICATE OF CORRECTION

PATENT NO. : 4,381,957             Page 1 of 4
DATED      : May 3, 1983
INVENTOR(S) : HENDRIK PUNTER ET AL It is certified that error appears in the above—identified patent and that said Letters Patent is hereby corrected as shown below:

Col. 1, before line 4, insert the following centered heading:   --BACKGROUND OF THE INVENTION--;

lines 5,6,8,9,10,15,19,24,27,33 and 34 (both Occurrences), change "aluminium" to --aluminum--;

line 12, delete "in the opening"
line 13, delete "paragraph"

between lines 41 and 42, insert the following centered heading:   --SUMMARY OF THE INVENTION--;

Col. 1, lines 40,49,53,59,61 and 66 change "aluminium" to --aluminum--;
line 42, change "the said" to --these--;

line 48, change "the opening paragraph" to --above--;

UNITED STATES PATENT AND TRADEMARK OFFICE
CERTIFICATE OF CORRECTION

PATENT NO. : 4,381,957

DATED : May 3, 1983

INVENTOR(S) : HENDRIK PUNTER ET AL

It is certified that error appears in the above—identified patent and that said Letters Patent is hereby corrected as shown below:

Col. 2, line 2,10,14,19,30,34,36,41,44 and 45, change "aluminium" to --aluminum--;

line 49, change "favourable" to --favorable--;

Col. 3, line 5, change "beside" to --alongside--
line 9, change "It may occur that after" to --After--;

line 11, change "is" to --may be--;
line 20, change "a" (first occurrence) to --the-- between lines 21 and 22 insert the following centered heading: --BRIEF DESCRIPTION OF THE DRAWING-- line 23, change "a" to --the--;

between lines 27 and 28, insert the following centered heading: --DESCRIPTION OF THE PREFERRED EMBODIMENTS--;

UNITED STATES PATENT AND TRADEMARK OFFICE
CERTIFICATE OF CORRECTION

PATENT NO. : 4,381,957

DATED : May 3, 1983

INVENTOR(S) : HENDRIK PUNTER ET AL

It is certified that error appears in the above—identified patent and that said Letters Patent is hereby corrected as shown below:

```
           line 53, change "desing" to --design--;
           line 67, after "1" insert --,--
  Col. 4, lines 8,23,24,32,37,38,42,43 and 44 change
           "aluminium" to --aluminum--;

line 8, change "It may occur that the" to
           --The--;
           line 9, change "is" to --may be--;
           line 18, change "manufacture" to --process--
           line 20, after "substrate" insert --there--
           line 23, after "shown" insert --,--;
           line 26, change "usual" to --conventional--
           line 33, delete ". of"
           line 37, change "said" to --specified--
           line 38, change "and" to --or--
           line 52, change "layer may be that" to --layer,--
           line 54, change "is" to --may be--
           line 58, delete "again"
  Col. 5, line 2 and 4, change "aluminium" to --aluminum--;
```

UNITED STATES PATENT AND TRADEMARK OFFICE
CERTIFICATE OF CORRECTION

PATENT NO. : 4,381,957

DATED : May 3, 1983

INVENTOR(S) : HENDRIK PUNTER ET AL

It is certified that error appears in the above—identified patent and that said Letters Patent is hereby corrected as shown below:

In the Claims:

Claim 1, lines 12,13,15,16,19 and 22, change "aluminium" to --aluminum-- (both occurrences)

Claim 2, line 28, change "aluminium" to --aluminum--
Claim 3, line 32, change "aluminium" to --aluminum--
Claim 4, line 35, change "aluminium" to --aluminum
Claim 8, lines 11 and 14 change "aluminium" to --aluminum--
Claim 9, line 17, change "aluminium" to --aluminum--

In the Abstract

Before line 1, delete in its entirety and substitute the following: --ABSTRACT OF THE DISCLOSURE-- line 4,6,7 and 14, delete "1,2"
   line 6, change "minium" to --minum--, delete "3";
   line 7, delete "4"
   line 9, delete "3", delete "5";
   line 11, delete "4";
   line 14, delete "5"

Signed and Sealed this

Fourth Day of December 1984

[SEAL]

Attest:

GERALD J. MOSSINGHOFF

Attesting Officer

Commissioner of Patents and Trademarks